(12) United States Patent
Fu et al.

(10) Patent No.: US 9,912,120 B2
(45) Date of Patent: Mar. 6, 2018

(54) BROADBAND TUNABLE EXTERNAL-CAVITY LASER USING SMALL MEMS MIRROR

(71) Applicant: Accelink Technologies Co., Ltd., Wuhan (CN)

(72) Inventors: Yanfeng Fu, Wuhan (CN); Yong Luo, Wuhan (CN); Di Zhang, Wuhan (CN); Xuesheng Tang, Wuhan (CN); Kun Qian, Wuhan (CN); Yi Tang, Wuhan (CN); Shenglei Hu, Wuhan (CN); Qianggao Hu, Wuhan (CN)

(73) Assignee: Accelink Technologies Co., Ltd. (CN)

( * ) Notice: Subject to any disclaimer, the term of this patent is extended or adjusted under 35 U.S.C. 154(b) by 0 days.

(21) Appl. No.: 15/106,580

(22) PCT Filed: Dec. 25, 2013

(86) PCT No.: PCT/CN2013/090436
§ 371 (c)(1),
(2) Date: Oct. 11, 2016

(87) PCT Pub. No.: WO2015/089869
PCT Pub. Date: Jun. 25, 2015

(65) Prior Publication Data
US 2017/0025819 A1    Jan. 26, 2017

(30) Foreign Application Priority Data
Dec. 20, 2013   (CN) .......................... 2013 1 0706006

(51) Int. Cl.
*H01S 3/10* (2006.01)
*H01S 5/14* (2006.01)
(Continued)

(52) U.S. Cl.
CPC .......... *H01S 5/143* (2013.01); *H01S 3/08086* (2013.01); *H01S 3/102* (2013.01);
(Continued)

(58) Field of Classification Search
CPC ...... H01S 3/08086; H01S 5/068; H01S 3/102; H01S 5/143; H01S 3/139; H01S 3/10; H01S 3/13; H01S 3/137
(Continued)

(56) References Cited

U.S. PATENT DOCUMENTS 6,822,979 B2   11/2004 Daiber
6,847,661 B2    1/2005 Jerman et al.
(Continued)

FOREIGN PATENT DOCUMENTS

CN    1509507 A    6/2004
CN    1516911 A    7/2004
(Continued)

OTHER PUBLICATIONS

International Search Report for Application No. PCT/CN2013/090436 dated May 5, 2014.

*Primary Examiner* — Tuan Nguyen
(74) *Attorney, Agent, or Firm* — Lerner, David, Littenberg, Krumholz & Mentlik, LLP

(57) ABSTRACT

A Raman pump laser control apparatus comprises a wavelength division multiplexer, a tap coupler, a photoelectric detector, an analog amplification processing circuit, an analog-to-digital converter, a fast Raman pump control unit, an digital-analog converter, and a Raman pump laser. The fast Raman pump control unit, after having known anticipated output light power of the Raman pump laser, based on a direct relationship between a current anticipated output light power of the Raman pump laser and input digital quantity that is needed by the digital-analog converter, uses a feed-
(Continued)

forward control mechanism so that actual output light power of the Raman pump laser fastly approximates the anticipated output light power thereof, and then synchronously combines with a feedback control mechanism so that the actual output light power of the Raman pump laser is precisely locked on the anticipated output light power, thereby achieving fast and precise control of the Raman pump laser.

17 Claims, 4 Drawing Sheets

(51) Int. Cl.
  *H01S 3/105* (2006.01)
  *H01S 3/08* (2006.01)
  *H01S 3/102* (2006.01)
  *H01S 5/068* (2006.01)
  *H01S 5/0683* (2006.01)
(52) U.S. Cl.
  CPC .............. *H01S 3/105* (2013.01); *H01S 5/068* (2013.01); *H01S 5/0683* (2013.01); *H01S 5/141* (2013.01)
(58) Field of Classification Search
  USPC .................................... 372/20, 18, 22, 50.11
  See application file for complete search history.

(56) References Cited

U.S. PATENT DOCUMENTS

| | | | |
|---|---|---|---|
| 6,850,545 B2 | 2/2005 | Asami | |
| 6,853,654 B2 | 2/2005 | McDonald et al. | |
| 6,856,632 B1 | 2/2005 | Heanue et al. | |
| 6,912,235 B2 | 6/2005 | Anthon et al. | |
| 7,209,498 B1 | 4/2007 | Chapman et al. | |
| 7,443,891 B1 | 10/2008 | Heanue et al. | |
| 2002/0126345 A1* | 9/2002 | Green | G02B 5/281 398/65 |
| 2003/0026302 A1* | 2/2003 | Anthon | H01S 5/141 372/29.01 |
| 2003/0039443 A1* | 2/2003 | Catchmark | B82Y 20/00 385/37 |
| 2004/0004979 A1* | 1/2004 | Lin | H01S 5/1032 372/20 |
| 2005/0094681 A1* | 5/2005 | Miyaki | H01S 5/141 372/20 |
| 2005/0111498 A1* | 5/2005 | Daiber | H01S 5/141 372/20 |
| 2005/0232530 A1* | 10/2005 | Kekas | G02F 1/133504 385/11 |
| 2009/0238217 A1* | 9/2009 | Moser | H01S 5/141 372/20 |

FOREIGN PATENT DOCUMENTS

| | | | |
|---|---|---|---|
| CN | 1541435 A | | 10/2004 |
| CN | 201774136 | * | 3/2011 |
| CN | 201774136 U | | 3/2011 |
| JP | 2002190642 A | | 7/2002 |

\* cited by examiner (a)

(b)

BROADBAND TUNABLE EXTERNAL-CAVITY LASER USING SMALL MEMS MIRROR

CROSS REFERENCE TO RELATED APPLICATIONS

The present application is a national phase entry under 35 U.S.C. §371 of International Application No. PCT/CN2013/090436 filed Dec. 25, 2013, published in China, which claims priority from Chinese Patent Application No. 201310706006.6 filed Dec. 20, 2013, all of which are incorporated herein by reference.

TECHNICAL FIELD

Embodiments of this invention relate to solutions of tunable laser, especially to a broadband tunable external-cavity laser with grating and MEMS mirror. The laser can be applied to DWDM optical communication system.

BACKGROUND

Multi-channel tunable laser has been focus in the industry in recent years. Tunable laser products have been widely used in 10 Gb/s and 40 Gb/s optical communication system. These applications mainly use multi-channel tunable laser product with semiconductor integration technology (SGDBR). However, applications of the coherent optical communication system with a rate of over 100 Gb/s raised higher demands for multi-channel tunable laser, that is, it required tunable laser with narrow linewidth feature, because system characteristics are restricted by signal phase noise. Therefore, external-cavity laser with great linewidth control ability is becoming popular, in terms of applications of the coherent optical communication system with a rate above 100 Gb/s, typical example of which is thermo-optical tuning micro-optics external-cavity laser by the EMCORE company with linewidth smaller than 100 kHz, which has been preferred product in 100 Gb/s coherent optical communication system. It is a kind of external-cavity laser based on double thermo-optical tunable etalon, and realizes multi-channel tuning function through thermo-optical vernier adjustment. However, heat is a physical quantity that is hard to be controlled precisely. Thus thermo-optical tuning needs high-precision temperature calibration, and the thermal relaxation occurred during the tuning process often affects the tuning speed and control precision of the device.

In fact, traditional tunable external-cavity laser technology has developed for many years, such as typical semiconductor tunable external-cavity laser with Littman and Littrow structure, which are tunable structures based on grating dispersion and mechanical movement system of the resonant cavity. Many kinds of solid tunable lasers with high frequency stabilization use this sort of structure, which is relatively mature now. However, due to the intrinsic structure and tuning demands of these lasers, it is difficult to adapt to the requirements of optical communication system for small volume, long-term stability and reliability. Key problem therein is volume of the device. With development of micro-machine (MEMS) technology, solution of using MEMS device to realize the mirror movement tuning function in Littman structure has been proposed (refer to US patents including U.S. Pat. No. 6,847,661, U.S. Pat. No. 6,856,632, U.S. Pat. No. 6,912,235 by the Iolon company and U.S. Pat. No. 7,443,891 by the Coherent Company of US). Characteristics of them are using electrostatic MEMS driving mechanism to realize rotation of reflex endoscope. However, reflecting mirror and electrostatic driving machine thereof are not in a same plane, so this kind of MEMS mechanism appears too enormous and complicated, with low yield, high production cost and relatively poor environmental adaptability.

FIG. 2 is a schematic diagram of the principle of optical path of the existing technology of Littman tunable laser. In order to improve the wavelength or product rate control precision of the laser, traditional Littman tunable laser has slightly large beam spot, and the endoscope at the adjustment side plane thereof has relatively large area. The tuning of the wavelength or frequency of the laser is realized through the rotation of the endoscope on end face. Since area of endoscope is large enough, it has good adaptability to tuning of the broadband.

SUMMARY OF THE INVENTION

Object of embodiments of the present invention is to provide a multi-channel tunable laser by setting tunable optical filter in external-cavity laser. Specifically, it is a tunable optical filter based on the "grating+MEMS rotating mirror" structure, which is an improved type of Littman laser structure. To meet the demands of the application, fixed grid filter is added to realize multi-channel precise positioning function. A technical measure in optical structure and phase control is proposed for characteristics guarantee of the tunable optical filter under wide bandwidth, small broadband multi-channel tunable laser based on the tuning of MEMS mirror is realized.

Embodiment of this invention provides multi-channel tunable external-cavity laser of improved type of Littman structure, that uses micro-optical devices to realize compact package structure of the external-cavity semiconductor laser device, mainly comprising precise grating, cantilever beam type MEMS rotating mirror, precise grid filter and micro shifter and so on. A tunable external-cavity laser according to an embodiment of the invention uses nanoscale grating to solves the spectral resolution precision problem of the illumination of micro spot beam. Besides, MEMS rotating mirror of cantilever beam type has compact structure and relatively better environmental adaptability, to adapt high speed driving. Broadband multi-channel tuning can be realized by continuously driving and adjusting MEMS rotating mirror of cantilever beam type. Whole volume of the laser with this structure decreases greatly. Further, because the device uses airtight laser component in package, the long-term stability and reliability thereof can be ensured.

Object of embodiments of the invention is achieved as following:
1. Positioning of multi-channel wavelength for special application is realized by grid filter.
2. By using grating, separation of broadband optical signal (light beam) in spatial direction is realized. By using continuous rotation of the MEMS mirror, the optional tuning of optical signal in different dispersion directions is formed respectively.
3. With a compact optical structure, function of using MEMS mirror with small area to collect large dispersion angle light beam signal and wide bandwidth tuning function are realized.
4. Method of combining passive phase compensation with precise phase compensation is used to realize phase compensation function in relatively large temperature variation condition.

5. Precise phase compensation is realized through precise endoscope displacement with closed-loop control, stable lasing condition of the laser is ensured.

Embodiment of the invention provides a broadband tunable external-cavity laser with small MEMS mirror, comprising a MEMS reflecting mirror (8), a grating (6), a first beam collimating lens (2), a semiconductor optical gain device (1), a second beam collimating lens (3) and an optical isolator (4) arranged in order, wherein the semiconductor optical gain device (1), the first beam collimating lens (2), the MEMS reflecting mirror (8) and the grating (6) constitute resonant cavity of the broadband tunable external-cavity laser, which further comprises a driving controller (13), which is connected with the MEMS reflecting mirror (8) and the semiconductor optical gain device (1), wherein the semiconductor optical gain device (1) provides gain of the broadband tunable external-cavity laser, and produces broadband multi-channel light beam. The first and the second beam collimating lens (2, 3) respectively form the collimating multi-wavelength beam inside the resonant cavity and output side of the broadband tunable external-cavity laser. The optical isolator (4) transmits collimating multi-wavelength light beam of the output side of the laser and isolates echo. The grating (6) divides the collimating multi-wavelength light beam inside the resonant cavity into light beams with different dispersion angles according to various wavelengths. The driving controller (13) adjusts the gain of the semiconductor optical gain device (1) and provides driving signal for MEMS reflecting mirror (8).

Therefore, the semiconductor optical gain device (1) ensures realization of stable lasing condition and enough light output power. Through rotation, the MEMS reflecting mirror (8) with the grating (6) constitute resonance to different wavelengths in laser resonant cavity so as to realize the wavelength tuning function of external-cavity laser. According to signal from the driving controller (13), position of MEMS reflecting mirror (8) is controlled and adjusted, the adjustment of Optical distance and phase is realized. In this way, by using fast micro-shifter, fast phase adjustment function can be realized.

According to an embodiment of this invention, the broadband tunable external-cavity laser also comprises micro-shifter (10) that is connected with the driving controller (13) to adjust position of the MEMS reflecting mirror (8) according to the signal from the driving controller (13).

According to an embodiment of this invention, the broadband tunable external-cavity laser also comprises temperature-phase compensator (9) for compensating for phase change due to the temperature change of resonant cavity of the broadband tunable external-cavity laser, that is set between the grating (6) and the grid filter (5). That is, Optical distance of passing beam is adjusted by controlling and adjusting temperature thereof.

Therefore, the broadband tunable external-cavity laser realizes the phase adjustment function controlled by temperature. Because of characteristics of temperature adjustment, the phase adjustment function has slow adjustment feature.

According to an embodiment of this invention, the mirror face of MEMS reflecting mirror (8) forms reflex of optical signal in different dispersion directions through continuous rotation, so as to form resonant lasing of these signals with certain wavelengths. Further, the MEMS reflecting mirror (8) uses small mirror cantilever beam structure, size of which is similar to that of beam spot of light beam that passes through the grating (6).

Therefore, because dispersion angle of the broadband optical signal after passing through the grating is relatively large, through a compact optical structure, function of using small MEMS mirror to collect optical signal with large dispersion angle is realized; passive phase compensation with precise phase compensation is used to realize phase compensation function in relatively large temperature variation condition, wherein, the precise phase compensation is realized by using precise displacement device to cause variation of cavity length.

According to an embodiment of this invention, the broadband tunable external-cavity laser also comprises convergent lens (7) set between the MEMS reflecting mirror (8) and the grating (6), for converging light beam from the grating (6) and inputting the converged light beam to the MEMS reflecting mirror (8).

According to an embodiment of this invention, the driving end of the MEMS reflecting mirror (8) is applied with triangular wave voltage for driving.

Therefore, by using etalon for special application wavelength channel intervals and certain bandwidth requirement, the grid filter is realized and accuracy of the working wavelength of the laser is ensured; to realize stability of the grid, the etalon can be a special passive etalon formed of material with zero temperature coefficient, or a etalon of temperature-compensation type formed of thermal-light material and with precise temperature control, which can also realize the function of flexible grid filter.

According to an embodiment of this invention, after the broadband multi-channel optical signal is divided after passing through the grating (6), 90% or above of energy is focused on first level of diffraction beam.

According to an embodiment of this invention, total optical distance $\Delta$ within the cavity conforms to the following equation:

$$\Delta = L1 \cdot n1 + L2 \cdot n2 + L9 \cdot n9 + L5 \cdot n5 + L6 \cdot n6 + L7 \cdot n7 + La \cdot 1,$$

wherein, L1 is round trip distance of light in the gain device 1; n1 is refractive index of the gain device 1; L2 is the round trip distance of light in the collimating lens 2; n2 is refractive index of the collimating lens 2; L5 is equivalent round trip distance of light in grid filter 5; n5 is refractive index of grid filter 5; L6 is round trip distance of light in grating 6; n6 is equivalent refractive index of light which passes through the grating 6; L7 is round trip distance of light in the convergent lens 7; n7 is refractive index of convergent lens 7; n9 and L9 are refractive index and thickness of the temperature-phase compensator 9 respectively; La and 1 are total air path length that light passes through in the cavity and air refractive index respectively.

According to an embodiment of this invention, $\Delta = Leff \cdot neff + L9 \cdot n9$, and $\delta(L9 \cdot n9) = -\delta(Leff \cdot neff)$, wherein $Leff \cdot neff = L1 \cdot n1 + L2 \cdot n2 + L5 \cdot n5 + L6 \cdot n6 + L7 \cdot n7 + La \cdot 1$, $\delta$ represents change of optical distance while experiencing change of temperature in wide temperature range; and according to the plus-minus sign and value of $\delta(Leff \cdot neff)$, the temperature-phase compensator (9) is formed of material with opposite refractive index-temperature property and appropriate thickness.

Therefore, as to problem of the difficulty in tuning light beam with large angle due to the large dispersion angle of the broadband optical signal after passing through the grating and small size of MEMS mirror, a lens with appropriate focal length is set between the grating and small MEMS mirror. Divergent multi-wavelength optical signal passing through the grating is converged to face of small MEMS mirror, which cause reflection effect on signal beams with different wavelengths in rotating of MEMS mirror uniformed, so as to ensure the wide bandwidth tuning function.

Therefore, as to the characteristics of relatively large variation of cavity length (optical distance) of the laser in large temperature difference condition and the insufficient compensation quantity of the precise phase compensation device, by using passive phase compensator with changes opposite to change of cavity length (optical distance) of the laser, rough compensation is realized. By using precise phase compensation device only to compensate for the phase margin that passive phase compensator fails to compensate, precise compensation for phase deviation caused by large range of change of cavity length (optical distance) of the laser is realized.

According to an embodiment of this invention, the micro-shifter (10) can be piezoelectric precise micro-shifter. Under closed-loop monitoring condition, the back-end mirror of the resonant cavity of the broadband tunable external-cavity laser is adjusted through precise micro-displacement, and phase of the broadband tunable external-cavity laser is adjusted in real-time.

Therefore, the light beam path changes caused by channel switch will cause change in phase condition of the external-cavity laser. Besides, by using precise phase compensation device to compensate for the phase variation that passive phase compensator fails to compensate precisely during temperature change, precise phase compensation function is carried out under closed-loop monitoring condition in real-time so as to ensure the stable working condition of the laser.

Embodiments of the invention have the following advantages:
1. It uses non-zero level high-efficient diffraction grating to form simplified Littman laser structure.
2. It uses small cantilever beam type of MEMS reflecting mirror to replace traditional large plane mirror, to realize the miniaturization of Littman laser.
3. By using special lens, difficulty to adapt in wide bandwidth signal tuning requirement due to small reflecting area of MEMS reflecting mirror can be solved. After adopting special lens structure, reflecting area of MEMS reflecting mirror can further decrease, thus enhancing vibration adaptability of MEMS.

BRIEF DESCRIPTION OF ACCOMPANYING FIGURES

Figure 1:
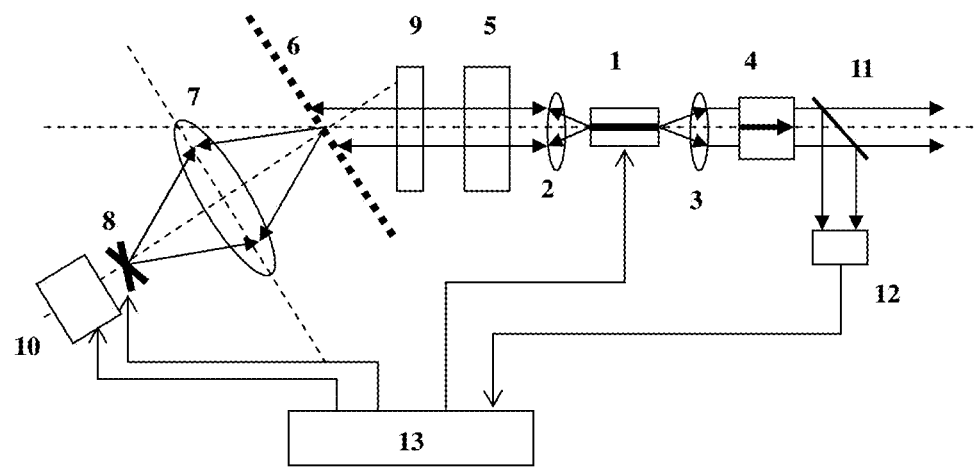
FIG. 1 is a schematic diagram of a broadband tunable external-cavity laser with small MEMS mirror according to an embodiment of the invention.

1: semiconductor optical gain device
2,3: beam collimating lens
4: optical isolator
5: grid filter
6: grating
7: convergent lens
8: MEMS reflecting mirror
9: temperature-phase compensator
10: micro-shifter
11: beam splitter
12: photodetector
13: driving controller

EMBODIMENTS

It is provided further detailed description thereof by using figures and specific embodiment to explain the principle of the invention.

The structure of the broadband tunable external-cavity laser according to an embodiment of the invention is shown in FIG. 1, which mainly comprises a semiconductor optical gain device 1, a first and a second beam collimating lenses 2 and 3, an optical isolator 4, a grid filter 5 (optional), a grating 6, a convergent lens 7 (optional), a MEMS reflecting mirror 8, a temperature-phase compensator 9 (optional), a micro-shifter 10 (optional), a beam splitter 11 (optional), a photodetector 12 (optional) and a driving controller 13. It constitutes a kind of external-cavity semiconductor laser with small-size and large tuning range.

Specifically, the broadband tunable external-cavity laser comprises a micro-shifter 10, a MEMS reflecting mirror 8, a grating 6, a first beam collimating lens 2, a semiconductor optical gain device 1, a second beam collimating lens 3, an optical isolator 4, a beam splitter 11 and a photodetector 12 arranged in order. The optical isolator 4 transmits the collimated multi-wavelength beam from output side and isolates echo to ensure that the laser can operate stably.

Further, the broadband tunable external-cavity laser also comprises a driving controller 13, which is connected with the micro-shifter 10, the MEMS reflecting mirror 8, the semiconductor optical gain device 1 and the photodetector 12, to realize driving and control of the broadband tunable external-cavity laser,
wherein the semiconductor optical gain device 1 provides gain of the broadband tunable external-cavity laser.

The first and second beam collimating lenses 2 and 3 form collimated multi-wavelength light beams inside the resonant cavity of the broadband tunable external-cavity laser and on output side respectively.

The grating 6 divides the collimated multi-wavelength light beam into multiple light beams with different dispersion angles according to wavelengths.

The MEMS reflecting mirror 8 forms a rotatable reflecting endoscope of the external-cavity laser.

Through rotation, the MEMS reflecting mirror 8 and the grating 6 form resonance of different wavelengths within the resonant cavity of the laser.

According to the signal from the driving controller 13, the micro-shifter 10 controls and adjusts position of the MEMS reflecting mirror 8 and realizes adjustment of optical distance and phase.

The beam splitter 11 splits a small part of output laser beam, and provides the split laser light beam to the photodetector 12, which detects the optical power of the part of the laser beam split by beam splitter 11, and provides the detected optical power to the driving controller 13.

According to the optical power detected by the photodetector 12, the driving controller 13 adjusts gain of the semiconductor optical gain device 1. The driving controller 13 also provides driving signal to the MEMS reflecting mirror 8.

The broadband tunable external-cavity laser can also comprises a grid filter 5 set between the grating 6 and the first beam collimating lens 2. The grid filter 5 chooses wavelength of the broadband multi-channel optical signal generated through the semiconductor optical gain device 1, wherein, the grating 6 is a diffraction grating, which separates broadband multi-channel optical signal after wavelength selection by the grid filter 5 in spatial direction in manner of dispersion.

The broadband tunable external-cavity laser can also comprises a temperature-phase compensator 9 set between the grating 6 and the grid filter 5. The temperature-phase compensator 9 adjusts the optical distance of passing light beam by controlling and adjusting temperature thereof, wherein, through continuous rotation, the mirror face of the MEMS reflecting mirror 8 forms reflections of the optical signal in different dispersion directions, so as to form resonant lasing of these signals with certain wavelengths. Wherein, the MEMS reflecting mirror 8 adopts a small mirror-face cantilever beam structure, size of the mirror face of which is close to size of beam spot of light beam passing through the grating 6.

The broadband tunable external-cavity laser can also comprise a convergent lens 7 set between the MEMS reflecting mirror 8 and the grating 6. The convergent lens 7 converges light beam from the grating 6 and inputs the converged light beam into the MEMS reflecting mirror 8.

Wherein, driving side of the MEMS reflecting mirror 8 is driven by applying a triangular-wave voltage.

Wherein, the broadband multi-channel light signal is separated through the grating 6, then over 90% of energy is concentrated on first level of diffraction beam.

Figure 5:
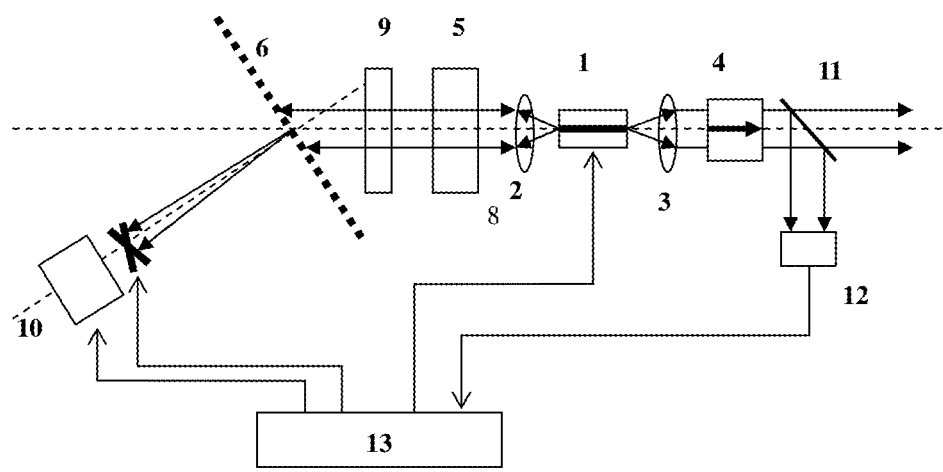
FIG. 5 is a schematic diagram of another broadband tunable external-cavity laser with small MEMS mirror according to an embodiment of the invention.

Another embodiment of this invention is for a simplified tunable laser with small dispersion angle, as shown in FIG. 5. FIG. 5 is a schematic diagram of another broadband tunable external-cavity laser with small MEMS mirror according to an embodiment of the invention. Compared with the broadband tunable external-cavity laser as shown in FIG. 1, the convergent lens 7 is omitted. For concise, those components same or similar as those in the broadband tunable external-cavity laser as shown in FIG. 1 are omitted. This structure is for two kinds of applications. One is for narrow wavelength or frequency tuning range. In this case, dispersion angle of beam is not large, so desired tuning range can be realized by slightly adjusting the angle of MEMS rotating mirror. Further, for requirement to larger tuning range, dispersion ability of the grating can be reduced to properly shrink beam angle. Depending on restriction by the characteristics, the structure is simpler.

Figure 6:
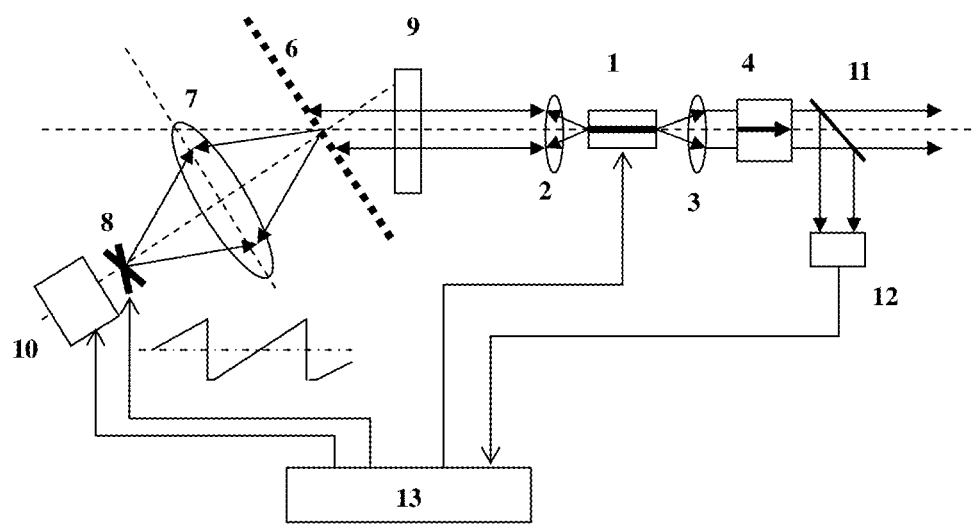
FIG. 6 is a schematic diagram of high-speed quasi-continuous tunable sweep-frequency laser with small MEMS mirror according to an embodiment of the invention; wherein, reference numerals are as follows.

Another example of the invention is for a high-speed quasi-continuous tunable sweep-frequency laser, as shown in FIG. 6. FIG. 6 is a schematic diagram of a high-speed quasi-continuous tunable sweep-frequency laser with small MEMS mirror according to an embodiment of the invention. Compared with the broadband tunable external-cavity laser in FIG. 1, the grid filter 5 that is used for channel calibration is omitted, and a triangular-wave voltage for driving (continuous voltage scanning here) is added on driving side of the MEMS reflecting mirror 8 to form reflections of the light beam in different dispersion directions so as to form resonant lasing of these signals with certain wavelengths. To make the explanation simple and clear, those components same or similar as those in the broadband tunable external-cavity laser as shown in FIG. 1 are omitted. By continuously changing angle of reflecting mirror face of the MEMS reflecting mirror 8, continuous tuning is realized. Considering discontinuity of cavity mode, in order to realize better continuous tuning function, on one hand, cavity length can be increased as much as possible; on the other hand, it can be realized through adjustment of adaptive micro-shifter.

Figure 2:
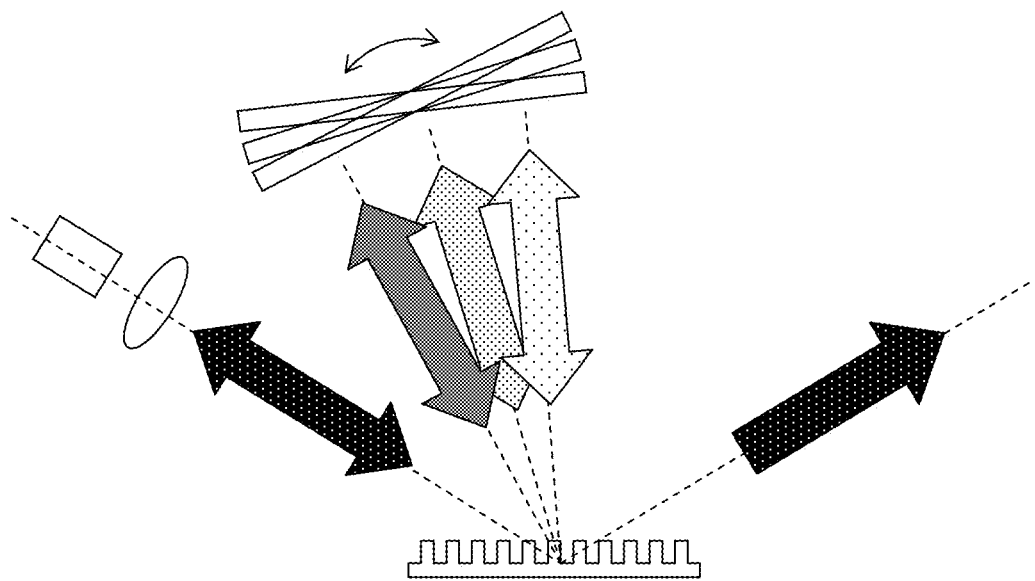
FIG. 2 is a principle diagram of light path of traditional Littman laser.

It shows that in order to realize small-volume Littman tunable laser (which is mentioned in "Background" part and shown in FIG. 2) compared with existing technology, embodiments of this invention take the following measures: firstly, lens with small beam spot (convergent lens 7) is used to shrink the beam spot of light beam in the resonant cavity; secondly, the more elaborate nanoscale grating (the grating 6) is chosen to make dispersion light beam passed through the grating have enough diffraction efficiency and wavelength angle resolution capability under small beam spot condition; thirdly, a MEMS rotating mirror (MEMS reflecting mirror 8) with small mirror cantilever beam structure is used, whose size is close to that of beam spot of light beam.

Figure 3:
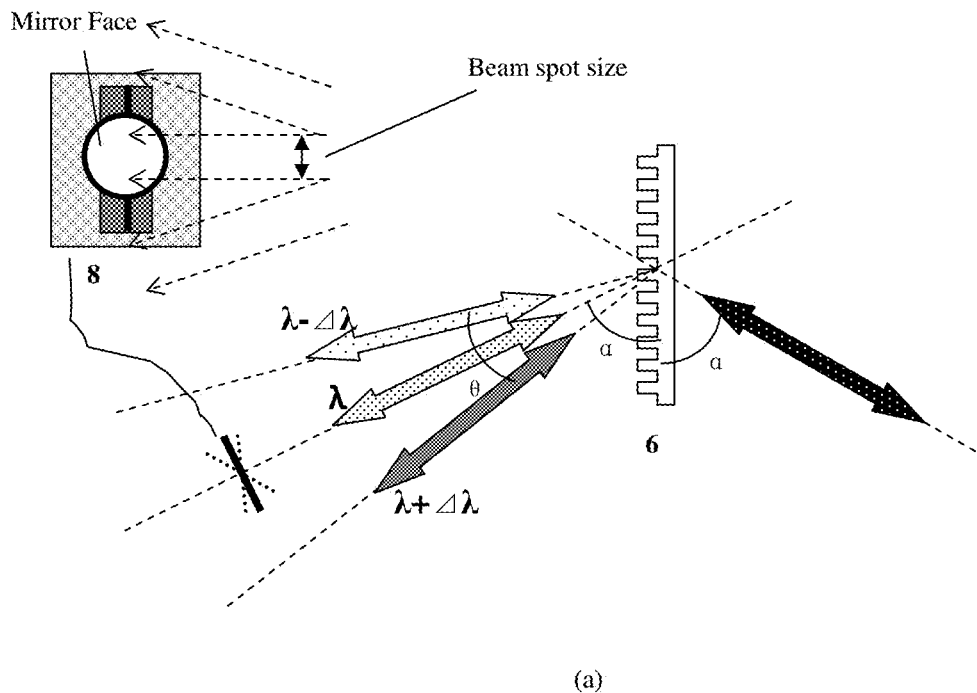
FIG. 3(a) is a schematic diagram of the light path of Littman laser with MEMS mirror according to an embodiment of the invention.
FIG. 3(b) is a schematic diagram of light path of Littman laser with MEMS mirror plus lens according to an embodiment of the invention.
Figure 3:
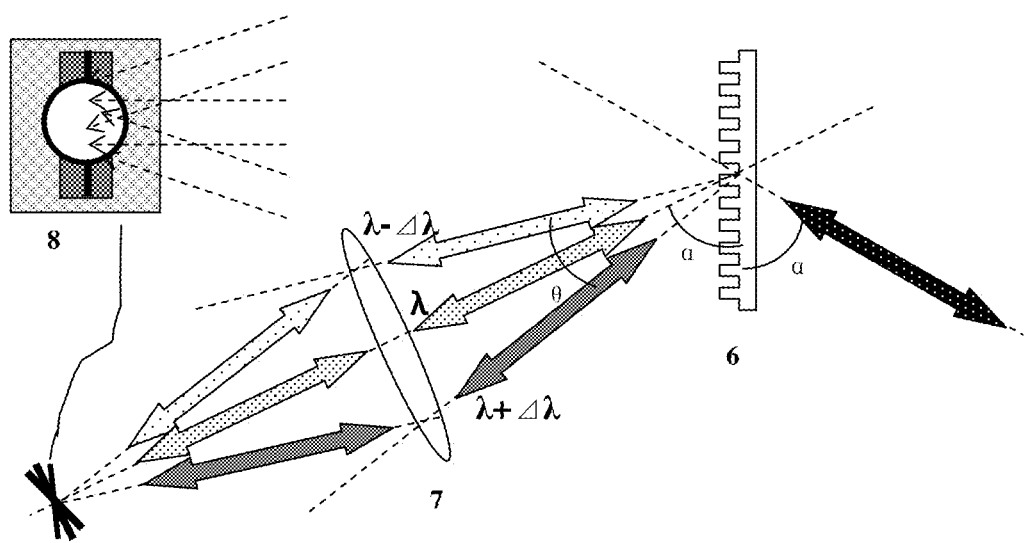

As shown in FIG. 3(*a*), since the size of MEMS reflecting mirror 8 is similar to that of beam spot of light beam, when MEMS cannot come closely to grating plane, the wavelength signal with large angle separated by dispersion of grating cannot form resonance through reflecting by MEMS mirror face. Therefore, a special light beam convergent lens (convergent lens 7) is used, that is set between the MEMS rotating mirror and the grating, as shown in FIG. 3(*b*). In this way, it can converge dispersion light beam with larger angle into the MEMS rotating mirror with small mirror face. Thus, through rotation of the MEMS rotating mirror, wide bandwidth wavelength tuning function of the laser can be realized.

In the figure, $\alpha$ is an is intersection angle between incident light beam as well as centre wavelength of the first level diffraction light beam and the grating plane, $\theta$ is an intersection angle between the light beam with the longest wavelength and that with the shortest wavelength among different wavelengths of diffraction light beam; $\lambda$ is the centre wavelength of the multi-wavelength light signal, $\lambda-\Delta\lambda$, is the shortest signal wavelength of the multi-wavelength light signal, $\lambda+\Delta\lambda$, is the longest signal wavelength of the multi-wavelength light signal.

Though the laser structure of embodiment of the invention adopts small optical device and optical platform temperature control system, the resonant phase condition of external-cavity laser is still likely to be affected by temperature because of temperature uniformity of devices. To ensure the resonant phase condition of the laser under large temperature variation condition, both of passive method and active method are implemented for phase compensation of the laser. The passive method uses the uniformity of the temperature environment variation and realizes the phase compensation by choosing special material with compensation structure. The active method slightly adjusts phase by inching the position of MEMS mirror face.

Figure 4:
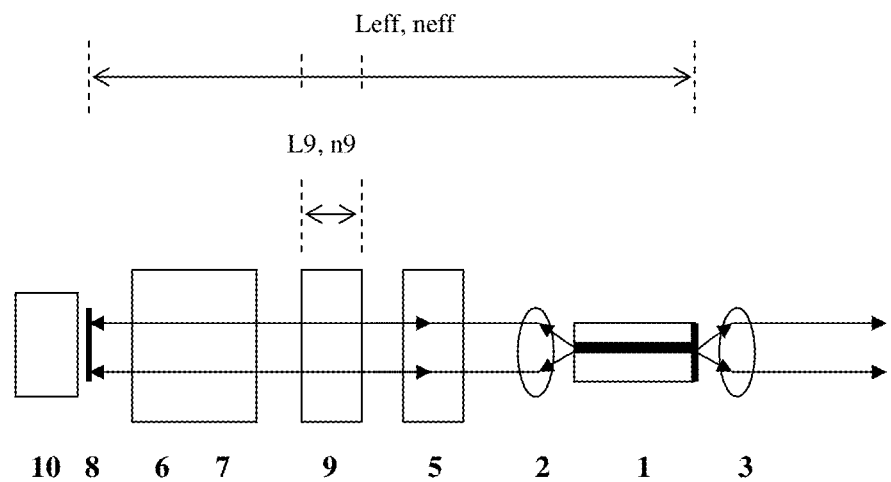
FIG. 4 is a schematic diagram of components and formation of optical distance within the cavity of the external-cavity laser according to an embodiment of the invention.

Principle of the passive phase compensation will be explained with combination of FIG. 4. As shown in FIG. 4, total optical distance $\Delta$ within the cavity of the laser meets the following relation:

$$A = L1 \cdot n1 + L2 \cdot n2 + L9 \cdot n9 + L5 \cdot n5 + L6 \cdot n6 + L7 \cdot n7 + La \cdot 1,$$

wherein, L1 is round trip distance of light in the gain device 1; n1 is refractive index of the gain device 1; L2 is the round trip distance of light in the collimating lens 2; n2 is refractive index of the collimating lens 2; L5 is round trip distance of light in grid filter 5; n5 is refractive index of grid filter 5; L6 is round trip distance of light in grating 6; n6 is equivalent refractive index of light which passes through the grating 6; L7 is round trip distance of light in the convergent lens 7; n7 is refractive index of convergent lens 7; n9 and L9 are refractive index and thickness of the temperature-phase compensator 9 respectively; La and l are total air path length that light passes through in the cavity and air refractive index respectively.

To make it simple, let $\Delta = Leff \cdot neff + L9 \cdot n9$,
wherein $Leff \cdot neff = L1 \cdot n1 + L2 \cdot n2 + L5 \cdot n5 + L6 \cdot n6 + L7 \cdot n7 + La \cdot 1$.

To realize optical distance compensation, let $\delta\Delta=0$ under temperature change with wide temperature range, that is, $\delta(L9 \cdot n9) = -\delta(Leff \cdot neff)$, wherein, $\delta$ is variation of optical distance when experiencing temperature change with wide temperature range. That is, $\delta(L9 \cdot n9)$ represents variation of optical distance of temperature-phase compensator 9 when experiencing temperature change with wide temperature range; $\delta(Leff \cdot neff)$ represents the sum of variation of optical distance of the semiconductor optical gain device 1, the collimating lens 2, the grid filter 5, the grating 6, the convergent lens 7 and the air in the cavity when experiencing the temperature change with wide temperature range.

Because compensation material used by the temperature-phase compensator 9 and other parts in the cavity experience same temperature change, by selecting special material with certain refractive index (n9) and thickness (L9), $\delta(L9 \cdot n9) = -\delta(Leff \cdot neff)$ can be met in wide temperature range, to realize the optical distance compensation in wide temperature range. Usually, it can be realized by choosing material with opposite refractive index-temperature property and appropriate thickness can be selected by calculation and experimental verification, according to the plus-minus sign and value of $\delta(Leff \cdot neff)$. This method can cancel most of the phase variation caused by the change of cavity length in wide temperature range, which can be called as passive phase compensation function.

On the other hand, in principle, active phase compensation is phase compensation by the movement of mirror face. By using micro-shifter 10 capable of fast moving to drive the MEMS rotating mirror, subtle change of phase can be compensated. Active phase compensation is mainly used to compensate for the precise and subtle phase difference that cannot be compensated by passive phase compensation, such as some fast and tiny phase perturbation. Active phase compensation can be also used to compensate for phase condition differences of channel tuning work with different wavelengths. After all, when MEMS rotating mirror is rotating for changing channel, light beam path is also changed. Active phase compensation is real-time feedback compensation implemented under feedback monitoring condition, so it needs to be supported by module control system.

The usage of micro devices shrinks the total volume of the Littman tunable laser, and the whole optical structure thereof is placed on a small optical flat board. Holistic temperature control and air-tight package can be realized. Compared with traditional Littman tunable laser, reliability and environmental adaptability of devices are enhanced.

Mentioned above are only a few embodiment examples of the invention. Though specific and detailed in description, they should not thereby be understood as limitations to the application scope of this invention. What should be noted is that, possible variations and modifications developed by ordinary technicians in this field, without departing from the inventive concept of this invention, are all covered in the protection scope of this invention. Thus the protection scope of this invention should be subject to the appended Claims.

The invention claimed is:

1. A broadband tunable external-cavity laser creating an output laser beam with small MEMS mirror, comprising a MEMS reflecting mirror, then a convergent lens, then a grating, then a temperature-phase compensator, then a grid filter, then a first beam collimating lens, then a semiconductor optical gain device, then a second beam collimating lens, then an optical isolator, and then a beam splitter arranged sequentially, wherein, the semiconductor optical gain device, the first beam collimating lens, the MEMS reflecting mirror and the grating constitute resonant cavity of the broadband tunable external-cavity laser, which further comprises a driving controller, which is connected with the MEMS reflecting mirror and the semiconductor optical gain device, wherein, the semiconductor optical gain device is for providing gain of the broadband tunable external-cavity laser, and producing broadband multi-channel light beam, the first and the second beam collimating lens are for forming the collimating multi-wavelength beams inside the resonant cavity and on output side of the broadband tunable external-cavity laser respectively, the optical isolator is for transmitting collimating multi-wavelength light beam on the output side to the beam splitter providing the output laser beam and isolating echo, the grating is for dividing the collimating multi-wavelength light beam inside the resonant cavity into light beams with different dispersion angles per wavelengths, the driving controller is for adjusting the gain of the semiconductor optical gain device and providing driving signal for the MEMS reflecting mirror, wherein the convergent lens is arranged sequentially between the MEMS reflecting mirror and the grating, wherein the temperature-phase compensator is arranged sequentially between the grating and the grid filter, and wherein the grid filter is arranged sequentially between the temperature-phase compensator and the first beam collimating lens.

2. The broadband tunable external-cavity laser of claim 1, also comprising a micro-shifter connected with the driving controller, to adjust position of the MEMS reflecting mirror according to signal from the driving controller.

3. The broadband tunable external-cavity laser of claim 2, wherein, the MEMS reflecting mirror rotates mirror face thereof continuously according to the driving signal of the driving controller, and the MEMS reflecting mirror is of small mirror cantilever beam structure, the size of the mirror thereof is close to size of beam spot passing the grating.

4. The broadband tunable external-cavity laser of claim 1, wherein the beam splitter and a photodetector are connected with the driving controller, wherein the beam splitter splits a part of the collimating multi-wavelength light beam on the output side, and providing the split light beam to the photodetector, which is for detecting optical power of laser light beam split from the beam splitter and providing value of detected optical power to the driving controller, which is for adjusting the gain of the semiconductor optical gain device according to the value of the optical power provided from the photodetector.

5. The broadband tunable external-cavity laser of claim 4, wherein, the MEMS reflecting mirror rotates mirror face thereof continuously according to the driving signal of the driving controller, and the MEMS reflecting mirror is of small mirror cantilever beam structure, the size of the mirror thereof is close to size of beam spot passing the grating.

6. The broadband tunable external-cavity laser of claim 1, wherein the resonant cavity also comprises therein the grid filter for transmitting light beam with certain wavelength among broadband multi-channel light beams generated from the semiconductor optical gain device, and wherein the grating is a diffraction grating, which separates the light beam with certain wavelength after passing the grid filter in spatial direction in a manner of dispersion.

7. The broadband tunable external-cavity laser of claim 6, wherein resonant cavity also comprises therein the temperature-phase compensator for compensating for phase change due to temperature change of the resonant cavity of the broadband tunable external-cavity laser.

8. The broadband tunable external-cavity laser of claim 7, wherein, after the broadband multi-channel optical signal is divided after passing through the grating, 90% or above of energy is concentrated on first level of diffraction beam.

9. The broadband tunable external-cavity laser of claim 7, wherein, the MEMS reflecting mirror rotates mirror face thereof continuously according to the driving signal of the driving controller, and the MEMS reflecting mirror is of small mirror cantilever beam structure, the size of the mirror thereof is close to size of beam spot passing the grating.

10. The broadband tunable external-cavity laser of claim 6, wherein, after the broadband multi-channel optical signal is divided after passing through the grating, 90% or above of energy is concentrated on first level of diffraction beam.

11. The broadband tunable external-cavity laser of claim 6, wherein, the MEMS reflecting mirror rotates mirror face thereof continuously according to the driving signal of the driving controller, and the MEMS reflecting mirror is of small mirror cantilever beam structure, the size of the mirror thereof is close to size of beam spot passing the grating.

12. The broadband tunable external-cavity laser of claim 1, wherein, the MEMS reflecting mirror rotates mirror face thereof continuously according to the driving signal of the driving controller, and the MEMS reflecting mirror is of small mirror cantilever beam structure, the size of the mirror thereof is close to size of beam spot passing the grating.

13. The broadband tunable external-cavity laser of claim 1, wherein resonant cavity also comprises therein the convergent lens for converging light beam from the grating and inputting the converged light beam to the MEMS reflecting mirror, wherein, diffraction beam of first level of the grating is normal incident to the convergent lens.

14. The broadband tunable external-cavity laser of claim 1, wherein, the driving controller is for driving a driving side of the MEMS reflecting mirror by a triangular-wave voltage.

15. The broadband tunable external-cavity laser of claim 1, wherein, total optical distance $\Delta$ within the cavity of the broadband tunable external-cavity laser conforms to the following equation:

$$\Delta = L1 \cdot n1 + L2 \cdot n2 + L9 \cdot n9 + L5 \cdot n5 + L6 \cdot n6 + L7 \cdot n7 + La \cdot 1,$$

wherein, L1 is round trip distance of light in the semiconductor optical gain device; n1 is refractive index of the semiconductor optical gain device; L2 is the round trip distance of light in the collimating lens; n2 is refractive index of the collimating lens; L5 is equivalent round trip distance of light in the grid filter; n5 is refractive index of the grid filter; L6 is round trip distance of light in the grating; n6 is equivalent refractive index of light which passes through the grating; L7 is round trip distance of light in the convergent lens; n7 is refractive index of the convergent lens; n9 and L9 are refractive index and thickness of the temperature-phase compensator respectively; La and 1 are total air path length that light passes through in the resonant cavity and air refractive index respectively.

16. The broadband tunable external-cavity laser of claim 15, wherein, $\Delta = \text{Leff} \cdot \text{neff} + L9 \cdot n9$, and $\delta(L9 \cdot n9) = -\delta(\text{Leff} \cdot \text{neff})$, wherein $\text{Leff} \cdot \text{neff} = L1 \cdot n1 + L2 \cdot n2 + L5 \cdot n5 + L6 \cdot n6 + L7 \cdot n7 + La \cdot 1$, $\delta(L9 \cdot n9)$ represents variation of optical distance of temperature-phase compensator when experiencing temperature change with wide temperature range; $\delta(\text{Leff} \cdot \text{neff})$ represents sum of variation of optical distance of the semiconductor optical gain device, the collimating lens, the grid filter, the grating, the convergent lens and the air within the resonant cavity when experiencing the temperature change with wide temperature range, and according to plus-minus sign and value of $\delta(\text{Leff} \cdot \text{neff})$, the temperature-phase compensator is formed of material with opposite refractive index-temperature property and appropriate thickness.

17. The broadband tunable external-cavity laser of claim 1, wherein the grating comprises a nanoscale grating configured to make a dispersion light beam passed through the grating having a diffraction efficiency and wavelength angle resolution adapted for a small beam spot.

* * * * *